US006816041B2

(12) United States Patent
Ammar et al.

(10) Patent No.: US 6,816,041 B2
(45) Date of Patent: Nov. 9, 2004

(54) MICROWAVE MONOLITHIC INTEGRATED CIRCUIT (MMIC) CARRIER INTERFACE

(75) Inventors: Danny F. Ammar, Windermere, FL (US); Gavin Clark, Tavares, FL (US)

(73) Assignee: Xytrans, Inc., Orlando, FL (US)

( * ) Notice: Subject to any disclaimer, the term of this patent is extended or adjusted under 35 U.S.C. 154(b) by 15 days.

(21) Appl. No.: 10/716,786

(22) Filed: Nov. 19, 2003

(65) Prior Publication Data

US 2004/0108922 A1 Jun. 10, 2004

Related U.S. Application Data

(63) Continuation of application No. 10/254,051, filed on Sep. 24, 2002, now Pat. No. 6,653,916, which is a continuation-in-part of application No. 09/933,128, filed on Aug. 20, 2001, now Pat. No. 6,498,551.

(51) Int. Cl.⁷ .................................................. H01P 3/08
(52) U.S. Cl. ........................ 333/246; 333/247; 333/260
(58) Field of Search ............................ 333/33, 34, 246, 333/247, 260; 257/691, 728, 699

(56) References Cited

U.S. PATENT DOCUMENTS

| | | | |
|---|---|---|---|
| 3,745,489 A | 7/1973 | Cristal et al. .................. 333/70 |
| 4,695,810 A | * 9/1987 | Heckaman et al. ............. 333/1 |
| 4,701,727 A | 10/1987 | Wong ......................... 333/204 |
| 4,851,793 A | 7/1989 | Heckaman et al. ............. 333/1 |
| 4,967,201 A | 10/1990 | Rich, III ..................... 342/175 |
| 4,992,759 A | 2/1991 | Giraudeau et al. ........... 333/204 |
| 5,134,539 A | 7/1992 | Tuckerman et al. ......... 361/311 |
| 5,146,453 A | 9/1992 | Nagler et al. .................. 370/16 |
| 5,214,844 A | 6/1993 | McWilliams et al. .......... 29/840 |
| 5,219,377 A | 6/1993 | Poradish ...................... 29/830 |
| 5,345,205 A | * 9/1994 | Kornrumpf .................. 333/246 |
| 5,451,883 A | 9/1995 | Staab ......................... 324/758 |
| 5,545,924 A | 8/1996 | Contolatis et al. ........... 257/724 |
| 5,552,752 A | 9/1996 | Sturdivant et al. ........... 333/243 |
| 5,557,245 A | 9/1996 | Taketa et al. ................ 333/116 |
| 5,619,399 A | 4/1997 | Mok .......................... 361/707 |
| 5,631,446 A | 5/1997 | Quan .......................... 174/254 |
| 5,644,277 A | 7/1997 | Gulick et al. ................ 333/246 |
| 5,668,408 A | 9/1997 | Nicholson ................... 257/699 |
| 5,729,433 A | 3/1998 | Mok .......................... 361/704 |
| 5,753,972 A | * 5/1998 | Wein et al. .................. 257/691 |
| 5,823,790 A | 10/1998 | Magnuson .................... 439/63 |
| 5,834,335 A | 11/1998 | Buschbom ................... 438/107 |
| 5,886,590 A | 3/1999 | Quan et al. ................... 333/33 |
| 5,948,960 A | 9/1999 | Langmack et al. ........... 73/1.88 |
| 5,982,186 A | 11/1999 | Buschbom ................... 324/755 |
| 5,982,250 A | 11/1999 | Hung et al. ................... 333/26 |
| 5,982,580 A | 11/1999 | Woldemar et al. ........ 360/97.02 |
| 6,039,580 A | 3/2000 | Sciarretta et al. ............. 439/63 |

(List continued on next page.)

Primary Examiner—Michael Tokar
Assistant Examiner—Linh Van Nguyen
(74) Attorney, Agent, or Firm—Allen, Dyer, Doppelt, Milbrath & Gilchrist, P.A.

(57) ABSTRACT

A microwave monolithic integrated circuit (MMIC) assembly and related method are disclosed. A dielectric substrate has a surface on which radio frequency circuits and microstrip lines are formed. At least one MMIC chip opening is dimensioned for receiving therethrough a MMIC chip. A metallic carrier is mismatched as to coefficient of thermal expansion to the dielectric substrate and includes a component surface adhesively secured to the dielectric substrate on the surface opposing the radio frequency circuits and microstrip lines. At least one raised pedestal is on the component surface that is positioned at the MMIC chip opening. A MMIC chip is secured on the pedestal and extends through the MMIC chip opening for connection to the radio frequency circuits and microstrip lines. Stress relief portions are formed in the metallic carrier that segment the carrier into subcarriers and provide stress relief during expansion and contraction created by temperature changes.

21 Claims, 6 Drawing Sheets

COMPONENT SIDE

BACK SIDE

U.S. PATENT DOCUMENTS

| | | | |
|---|---|---|---|
| 6,041,245 A | 3/2000 | Mansour | 505/210 |
| 6,079,999 A | 6/2000 | Terry et al. | 439/326 |
| 6,091,868 A | 7/2000 | Tartarilla et al. | 385/19 |
| 6,114,869 A | 9/2000 | Williams et al. | 324/765 |
| 6,124,636 A | 9/2000 | Kusamitsu | 257/728 |
| 6,130,189 A | 10/2000 | Matthaei | 505/210 |
| 6,130,587 A | 10/2000 | Jun et al. | 333/24.2 |
| 6,137,296 A | 10/2000 | Yoon et al. | 324/754 |
| 6,175,287 B1 | 1/2001 | Lampen et al. | 333/247 |
| 6,192,576 B1 | 2/2001 | Tan et al. | 29/714 |
| 6,198,367 B1 | 3/2001 | Matsunaga et al. | 333/246 |
| 6,217,382 B1 | 4/2001 | Ziers | 439/578 |
| 6,242,933 B1 | 6/2001 | Yap | 324/755 |
| 6,249,439 B1 | 6/2001 | DeMore et al. | 361/752 |
| 6,252,415 B1 | 6/2001 | Lefever et al. | 324/761 |
| 6,265,774 B1 | 7/2001 | Sholley et al. | 257/728 |
| 6,498,551 B1 | 12/2002 | Ammar et al. | 333/247 |
| 6,704,197 B2 * | 3/2004 | Iwamiya | 361/690 |
| 2002/0084852 A1 | 7/2002 | Cook et al. | 330/286 |

* cited by examiner

MICROWAVE MONOLITHIC INTEGRATED CIRCUIT (MMIC) CARRIER INTERFACE

RELATED APPLICATION

This application is a continuation of Ser. No. 10/254,051 filed Sep. 24. 2002, now U.S. Pat. No. 6,653,916 which is a continuation-in-part of Ser. No. 09/933,128 filed Aug. 20, 2001, now U.S. Pat. No. 6,498,551 issued Dec. 24. 2002, the disclosures of which are hereby incorporated by reference in their entirety.

FIELD OF THE INVENTION

This invention relates to microwave monolithic integrated circuits (MMIC), and more particularly, this invention relates to interfaces and carriers used for mounting MMIC chips such as used in millimeter wave modules (MMW).

BACKGROUND OF THE INVENTION

Millimeter wave (MMW) modules are becoming more commonplace as increasing use is made of millimeter wave transceivers and similar millimeter wave devices. Often, these modules are used with various transceiver designs having different transmitter and receive circuits that make use of a number of different microwave monolithic integrated circuit (MMIC) chips or die. Many of the MMIC chips are formed from Galium Arsenide (GaAs). These chips are often attached on an alumina, i.e., aluminum oxide, or similar dielectric substrate. Because of the extreme tolerances and necessity for thermal matching, millimeter wave modules typically use an expensive coefficient of thermal expansion (CTE) matched housing material, such as copper tungsten (CuW) or aluminum silicon carbide (AlSiC) to mount Galium Arsenide MMIC chips and the alumina or similar dielectric substrates. CTE matching is required to prevent the MMIC chips and the substrates on which they are attached from cracking as the housing material shrinks and expands during extreme temperature variations.

Most millimeter wave Galium Arsenide MMIC dies or chips and the accompanying ceramic substrates have a Coefficient of Thermal Expansion (CTE) that is between about 4 and 7 ppm/deg. centigrade (in some instances, closer to between about 4 and 6 ppm/deg. centigrade). This has required the use of similarly matched housing materials, such as the copper tungsten or aluminum silicon carbide materials as a metal carrier (or base plate of a housing) for heat sinking and attachment. Unfortunately, the lower cost housings, such as formed from aluminum, copper and other similar metallic or other materials, have a very high coefficient of thermal expansion, greater than about 16 ppm/deg. Centigrade, and therefore, cannot be used. The use of CTE matched carrier material has been required in the past to prevent the chips and substrates from cracking as the carrier material shrinks and expands versus temperature.

In some prior art modules, an epoxy preform is used to attach a ceramic substrate having MMIC chips to a carrier. Compliant epoxy has been used extensively in the past to attach CTE mismatched materials. The compliant characteristics of the epoxy allows it to have some elasticity, which enables the mismatched materials to expand at different rates without being separated. However, every compliant epoxy has a limited amount of elasticity, which limits the size of the bonded material to a few mils. The size of the bonding area has been restricted by the amount of CTE and mismatch. For example, the higher the CTE mismatch, the smaller is an allowable compliant epoxy bonding area.

An example of using non-CTE matched material that is less in cost is disclosed in the incorporated by reference Ser. No. 09/933,128 patent application and provides a unique structure and method to interface a housing and substrate material, both having a different coefficient of thermal expansion, without damaging or impacting the performance of the MMIC chip, RF interconnects and other material components. The millimeter wave (MMW) module for the microwave monolithic integrated circuit (MMIC) includes a carrier board formed of a dielectric material and having at least one MMIC die (chip) mounted thereon, and at least one interface line. A base plate is formed of a material that has a higher, unmatched coefficient thermal expansion (CTE) than the carrier board. The base plate supports the carrier board.

A housing is mounted over the carrier board and engages the base plate. This housing has at least one waveguide or subminiature coaxial connector (SMA) interface mounted thereon. A flexible circuit interconnect connects the subminiature coaxial connector(s) and the MMIC die through the interface line. A thermal interface member is positioned between the carrier board and base plate to aid in heat transfer between the base plate and housing and the lower CTE carrier board.

The flexible circuit interconnect could be formed as one of fuzz buttons or spring loaded self-adjusting interconnects, including the use of modified forms of pogo pins and similar spring segments and resilient members. The carrier board preferably, but not necessarily, comprises a plurality of layers of low temperature transfer tape (LTTT) to form a multilayer substrate board. The base plate and housing are formed from a material such as aluminum and/or similar metallic material. The thermal interface member comprises a heat transfer gasket that is formed from one of at least a phase change material, thermally conductive elastomer, or thermally conductive paste. Fasteners can secure the base plate and housing together.

Although this type of assembly solves the interface problem to allow the floating of a ceramic or other board material relative to a housing, including a base plate or carrier, there are still improvements that can be made by applying a MMIC assembly onto a CTE matched carrier. Some prior art techniques use an alumina substrate where Galium arsenide or other MMIC chips are attached directly to the CTE matched material either with solder or with silver epoxy. To provide efficient cooling for the MMIC chips, holes are cut through the ceramic and raised pedestals on the CTE matched carrier are used to directly attach the MMIC chips. The pedestals are also used to maintain the mounting surface of the MMIC chips at approximately the same level as the top portion of the ceramic board where all the radio frequency (RF) circuits and microstrip lines are present. In many chip and wire applications, co-planarity of the chip surface and the microstrip line is critical for radio frequency performance. Although the pedestals work well, the machining used to raise these areas is expensive because tight tolerances are required for precisely inserting the pedestals into cut holes on the ceramic board and provide a flat surface for mounting the chips.

It would be advantageous to replace a CTE matched carrier with a non-CTE matched carrier that is less expensive without having cracking and carrier material shrinkage or expansion versus temperature while also allowing the use of a large carrier.

SUMMARY OF THE INVENTION

The present invention advantageously sections a carrier into smaller subcarriers and eliminates the size limitation. In effect, the carrier has no size limitation. The present invention provides a microwave monolithic integrated circuit (MMIC) assembly where a dielectric substrate such as formed from alumina or other ceramic material has a surface on which radio frequency circuits and microstrip lines are formed. At least one MMIC chip opening is dimensioned for receiving therethrough a MMIC chip. A metallic carrier having a mismatched coefficient of thermal expansion to the dielectric substrate includes a component side or surface, which is secured to the dielectric substrate on the side (surface) opposing the radio frequency circuits and microstrip lines. The metallic carrier has at least one raised pedestal on the component side that is positioned at the MMIC chip opening. A MMIC chip secured on the pedestal and extends through the MMIC chip opening for connection to the radio frequency circuits and microstrip lines. Stress relief portions are formed in the metallic carrier that segment the carrier into subcarriers and provides stress relief during expansion and contraction created by temperature changes.

In one aspect of the present invention, the MMIC chip includes a circuit connection surface wherein the pedestal is dimensioned such that the circuit connection surface of the MMIC chip is positioned coplanar with the radio frequency circuits and microstrip lines on the dielectric substrate. The stress relief portions can be formed as grooves within the side of the metallic carrier opposite the component side or formed as cuts that extend through the carrier.

In yet another aspect of the present invention, the metallic carrier is formed substantially from copper or aluminum. The metallic carrier has a coefficient of thermal expansion between about 16 and about 17 ppm/degree centigrade and the MMIC chip and dielectric substrate has a coefficient of thermal expansion between about 6 and about 7 ppm/degree centigrade. An adhesive is positioned on those areas corresponding to subcarriers for adhesively securing the substrate to the carrier. In one aspect of the invention, the adhesive comprises a compliant epoxy.

In yet another aspect of the present invention, the stress relief portions comprise etched portions in which the metallic carrier has been removed. The subcarriers can be formed by etching the metallic carrier.

A method aspect of the invention allows the interfacing of a ceramic substrate, at least one microwave monolithic integrated circuit (MMIC) and metallic carrier having a coefficient of thermal expansion (CTE) that is not matched with a ceramic substrate and a MMIC. The method comprises the steps of segmenting the carrier with stress relief portions to form subcarriers and bonding the carrier with the ceramic substrate by an adhesive positioned at the subcarriers such that the stress relief portions and formed subcarriers provide stress relief during expansion and contraction created by temperature changes.

In yet another aspect of the present invention, the step of segmenting the carrier comprises the step of etching the carrier to form the stress relief portions. The segmenting can be accomplished by forming grooves on the carrier or by forming cut lines that extend through the carrier for segmenting the carrier into subcarriers.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
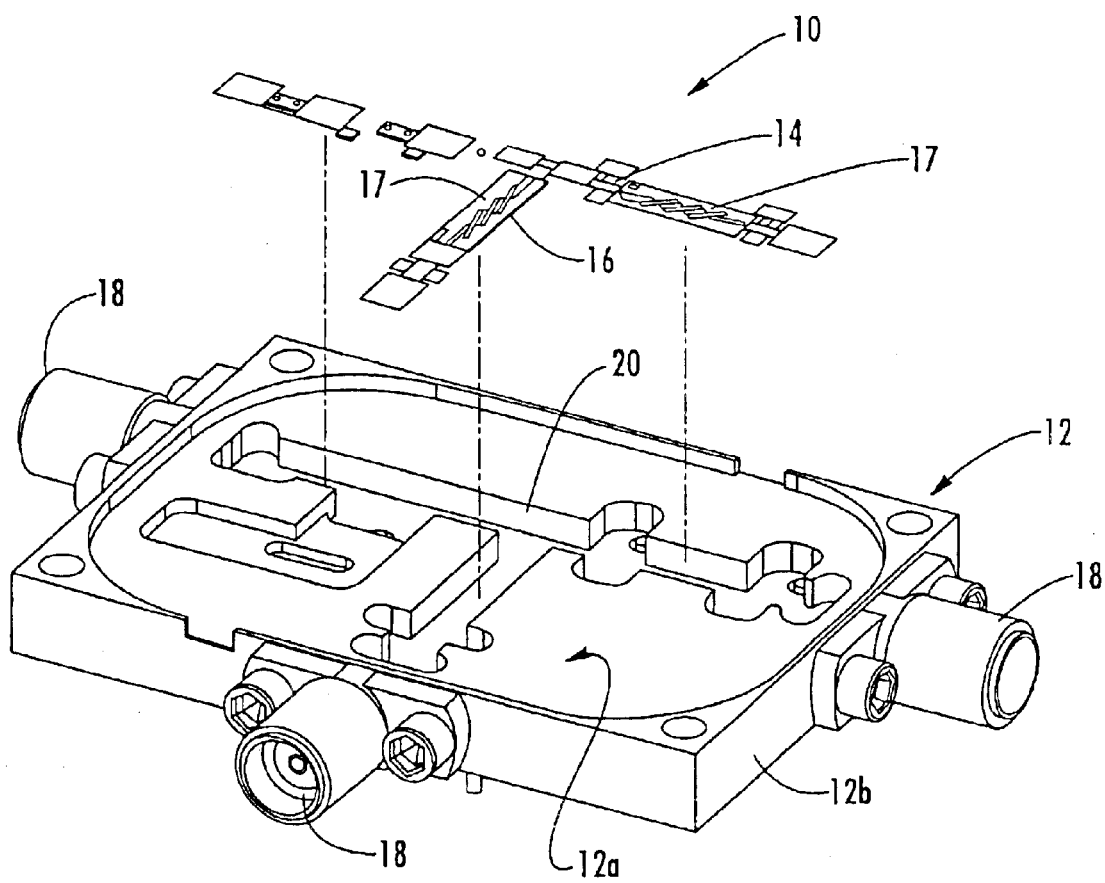
FIG. 1 is an exploded isometric view of a prior art millimeter wave (MMW) module having a CTE matched housing.

FIG. 1 illustrates a prior art millimeter wave (MMW) module 10, such as used for a millimeter wave RF transceiver or similar device, with a housing 12 formed of a CTE matched material, including a metal carrier surface 12a and protective housing 12b. This housing is formed from a CTE matched material, such as copper tungsten (CuW) or aluminum silicon carbide (AlSiC), and used to mount Galium Arsenide microwave monolithic integrated circuit (MMIC) die or chips 14 with associated alumina or similar ceramic or other material substrates used as a carrier board 16. RF signal lines 17 connect various elements as known to those skilled in the art. The housing 12 is expensive and includes the various coaxial or other cable connectors 18 and machined chip and substrate receiving channels 20, as illustrated. The coefficient of thermal expansion for the housing and substrate/MMIC chip is closely matched. In this type of design, the CTE match prevents the MMIC chips and die and associated carrier boards, including single and multilayer substrates, from cracking as the housing material shrinks and expands during temperature fluctuations.

Figure 1A:
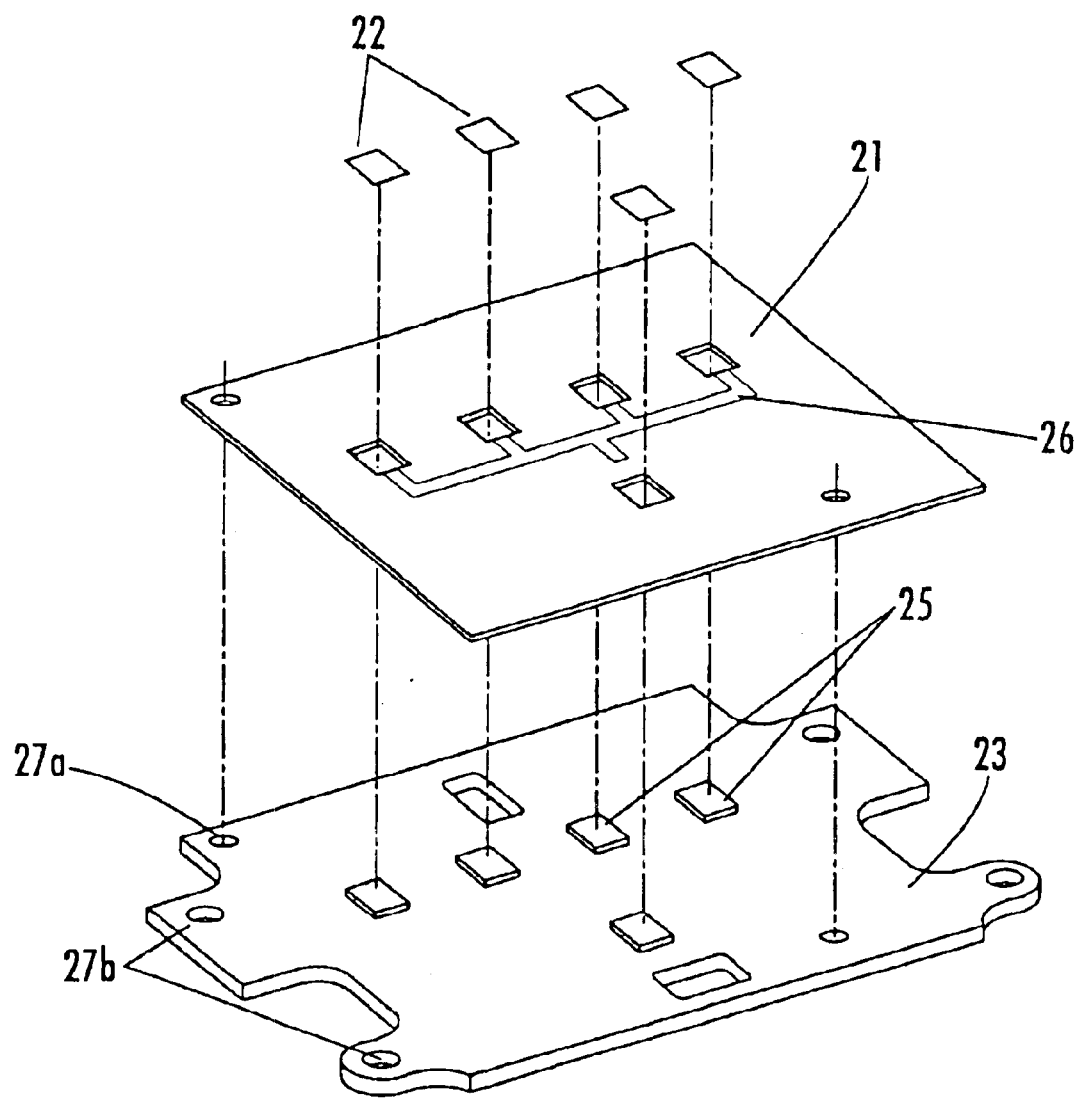
FIG. 1A is an exploded, isometric view of a prior art MMIC chip assembly with a CTE matched carrier where the alumina substrate and Galium Arsenide chips are attached directly to the CTE matched material using raised pedestals and holes.

FIG. 1A illustrates a prior art MMIC assembly with a CTE matched carrier. The alumina or other ceramic substrate 21 is a circuit board and Galium Arsenide or other MMIC chips 22 are attached directly to the CTE matched carrier material 23 either with solder or with silver epoxy. To provide efficient cooling for the MMIC chips 22, holes 24 are cut through the alumina or other ceramic substrate (board) 21 and raised pedestals 25 on the CTE matched carriers are used to directly attach the MMIC chips 22. Alignment holes 27a aid in aligning the substrate to the carrier using alignment mechanisms known to those skilled in the art. Mounting holes 27b aid in mounting the carrier to a chassis or other means by attachment mechanisms known to those skilled in the art. The pedestals 25 are also used to maintain the mounting surface of the chips at approximately the same level as the top of the alumina or ceramic board where all are radio frequency (RF) circuits and microstrip lines 26 are present. In a typical chip and wire application, co-planarity of the chip surface and a microstrip line is critical for radio frequency performance. These pedestals are typically machined, but are expensive because of the type of tolerances required for precisely inserting the pedestals into the cut holes on the ceramic or aluminum board and also to provide the necessary flat surface for mounting MMIC chips. As is conventional, the carrier 23 can be formed from aluminum silicon carbide (AlSic) or copper tungsten (CuW) for CTE matching.

It is well known that any type of compliant epoxy or other material used in this type of prior art application has a restriction on the size of any carrier or two surfaces that can be applied to each other, especially when there is a CTE mismatch. For example, in a typical application specific chart for compliant epoxy types such as from DIEMAT, the disclosure which is hereby incorporated by reference, it is evident that different epoxy types such-as a DIEMAT 4030LD could be used to epoxy a ceramic board to a copper carrier (delta TCE=10). The largest dimension, however, of the two materials can be as high as 1.4 inch in diagonal or a 1×10 inch square. The chart sets forth that larger surfaces cannot be supported. It is well known that compliant epoxy has been extensively used in the past to attach CTE mismatched materials. Those skilled in the art epoxy allows it to have some elasticity to enable mismatched materials to expand at different rates without being separated. Every compliant epoxy, however, has a limited amount of elasticity which limits the size of the bonded material to a few mils as shown in the incorporated by reference DIEMAT chart. The present invention segments a large carrier into smaller subcarriers and eliminates this size limitation. Thus, in effect, the carrier has no size limitation.

The present invention is advantageous and uses metal thinning and segmentation techniques to allow the bonding of large surface areas such as with compliant epoxy with large CTE mismatch. The segmentation and thinning of a carrier base plate (or carrier) provides stress relief during expansion and contraction due to temperature changes. For example, as shown in FIGS. 4A, 4B, 5A and 5B, and explained in detail later, a large carrier is segmented into smaller sections. The costly machining of the pedestals is replaced by low cost chemical etching of copper plate, such as a nickel plated copper plate, as a carrier base plate and having a CTE between about 16 and 17 ppm/degrees C. In addition to the etching of the pedestal, the backside of the carrier is etched and divided into smaller subcarriers, also thinning out thickness of the material. The alumina or ceramic board is attached to the subcarrier by using compliant epoxy, such as DIEMAT 4030LD. The MMIC chips are attached directly to the copper carrier on the top of the pedestals, using a compliant epoxy with adequate thermal properties, such as Diemat 6030HK. The compliant epoxy provides improved thermal transfer without the need for soldering.

For purposes of background, a millimeter wave module (MMW) for a microwave monolithic integrated circuit (MMIC) with an improved interface for a carrier base plate and housing cover as set forth in the incorporated by reference Ser. No. 09/933,128 application is first explained and described with reference to FIGS. 2 and 3 and followed by a description of the present invention.

Figure 2:
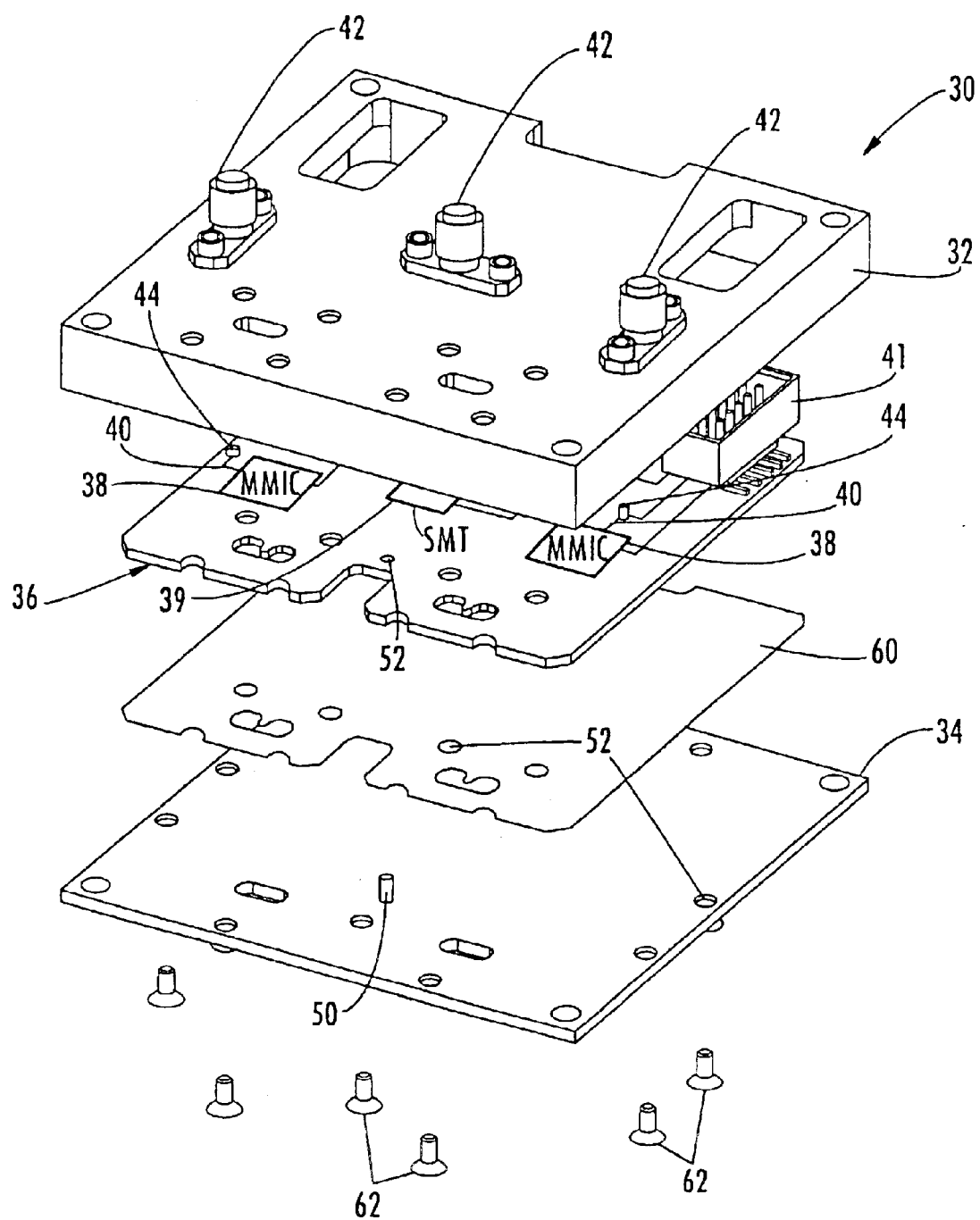
FIG. 2 is an exploded isometric view of a housing with waveguide and SMA interfaces and corresponding base plate, and a dielectric substrate material as a carrier board for MMIC chips, the housing and carrier base plate having different coefficients of thermal expansion than the ceramic substrate and MMIC chip.

FIG. 2 is an exploded isometric view of a Millimeter Wave (MMW) module 30 of the present invention, and showing a housing 32 and carrier base plate 34, and dielectric substrate forming a circuit board 36 (or carrier board by some skilled in the art). The housing and carrier base plate have different coefficient of thermal expansions than the circuit board. An interface is provided between the high CTE material, such as aluminum for the housing 32 and carrier base plate 34, and the low CTE material, such as an alumina circuit board 36, without impacting performance.

As illustrated, the circuit board 36 is formed of a dielectric material, such as alumina or other ceramic material, and has at least one MMIC die (chip) 38 mounted thereon and other surface mount technology (SMT) components 39. At least one interface line 40 is connected to the MMIC chip and other surface mount technology components. The interface line 40 is formed typically as a 50 Ohm microstrip interface line on the circuit board by fabrication techniques known to those skilled in the art. This circuit board 36 "floats" relative to the CTE mismatched carrier base plate 34 and housing 32, formed of a material having a higher and unmatched coefficient of thermal expansion (CTE) than the ceramic board and supporting same. Other cable or interconnect components 41 can be mounted on circuit board 36 as illustrated.

In one aspect of the present invention, the carrier base plate 34 is formed from a low cost alumina, a similar aluminum alloy, or other similar commercially available material that is low cost and desirable for these module applications. As illustrated, the MMIC die or chips 38 are preferably attached directly to the top of the circuit board 36, which is formed as an alumina board or similar material and having the CTE mismatch from the aluminum carrier base plate, but similar to the GaAs MMIC devices. The housing 32 is formed from aluminum or similar material and cooperates with the carrier base plate and mounted over the circuit board 36 and engages the carrier base plate 34. The housing 32 has at least one waveguide or subminiature coaxial connector interface mounted thereon, such as a waveguide and subminiature coaxial connector (SMA) 42 interface, as known to those skilled in the art.

Subminiature coaxial connectors (SMA) are commonly used by those skilled in the art and are known as semi-precision, subminiature devices that are used with coaxial cables, including flexible and semi-rigid cabling. They are used up to about 18 GHz with semi-rigid cabling, and with flexible cable, the SMA connectors are typically from DC values to about 12.4 GHz. The SMA connectors are operable at broadband frequencies and have low reflections. They can be designed to have a constant 50 Ohm impedance, as known to those skilled in the art. Many different type of SMA connectors are commercially available through many different companies, including Light House Technologies, Inc. of San Diego, Calif., and Johnson Components of Waseca, Minn. They are available in pressure crimp, clamp and solder terminal attachments and provide interconnections from various board striplines to coaxial cable, as known to those skilled in the art.

The housing 32 is typically formed of a material having a coefficient of thermal expansion (CTE) similar to the carrier base plate 34, and as noted before, can be formed of the lower cost aluminum. A flexible circuit interconnect 44 (or interface) connects the waveguide or subminiature coaxial connector 42 and the MMIC die 38 through the microstrip (preferably 50 Ohm) interface line 40 and allows the circuit board 36 to shift relative to the housing 32 without signal degradation. Thus, a flexible interface is provided between the RF signal on the carrier board and any coaxial connectors, such as the SMA connectors, positioned on the housing.

Although fuzz buttons 44 are used in one aspect of the present invention for the flexible circuit interconnects, other spring-loaded self-adjusting interconnects can be used. Many different types of fuzz buttons are commercially available and can be modified for use with the present invention. One type of fuzz button is a gold plated molybdenum wool that fills passages through a material to provide conductive pathways. One size example is about 0.010 inch diameter by 0.060 inch in length. Examples of fuzz buttons are disclosed in U.S. Pat. Nos. 5,552,752; 5,631,446; 5,146,453; 5,619,399; 5,834,335; 5,886,590; 6,192,576; and 5,982,186. These and any other fuzz buttons can be modified to be operable with the present invention. Other types of spring-loaded self-adjusting interconnects can also be used, including modified pogo pin connectors, which can include wires, pins or cables formed as spring segments or other resilient members. Examples of various types of pogo pins are disclosed in U.S. Pat. Nos. 6,252,415; 6,242,933; 6,137,296; 6,114,869; 6,079,999; 5,451,883; and 5,948,960.

At least one alignment member 50 is mounted on the carrier base plate 34. The circuit board 36 has a guide receiver 52 that receives the alignment member 50 for aligning the circuit board relative to the carrier base plate without damage due to CTE mismatch. In one aspect of the present invention, the alignment member comprises an alignment pin that aligns with a guide hole or notch.

As illustrated, a thermal interface member 60 is positioned between the circuit board 36 and carrier base plate 34 to aid in heat transfer between the base plate and housing and the lower CTE carrier board. This thermal interface member can be formed as a heat transfer gasket and can be formed from one of at least a phase change material, thermally conductive elastomer, or thermally conductive paste. This aids in supporting the heat transfer and the "floating" of the board. Although not illustrated in detail, an EMI gasket can be positioned between the circuit board and housing or top cover. It does not provide a mechanically adhesive interface. The two components float relative to each other, allowing even greater CTE mismatches than possible with epoxy. It also facilitates rework.

Fasteners 62 are used to hold the carrier base plate 34 and housing 32 mounted over the circuit board 34 together as a unit. The fasteners 62 can be any type of fastener suggested by those skilled in the art, but in the illustrated embodiment, are shown as screws. This particular structure is well designed for a millimeter wave transceiver design, such as disclosed in commonly assigned U.S. patent application Ser. No. 09/862,982, filed May 22, 2001. This type of transceiver design can include a number of different MMIC chips and a carrier board that is formed as a plurality of layers of low temperature transfer tape (LTTT) that form a multilayer substrate board using low temperature co-fired ceramic material, modified and formed as low temperature transfer tape using fabrication, printing and manufacturing techniques known to those skilled in the art.

Figure 3:
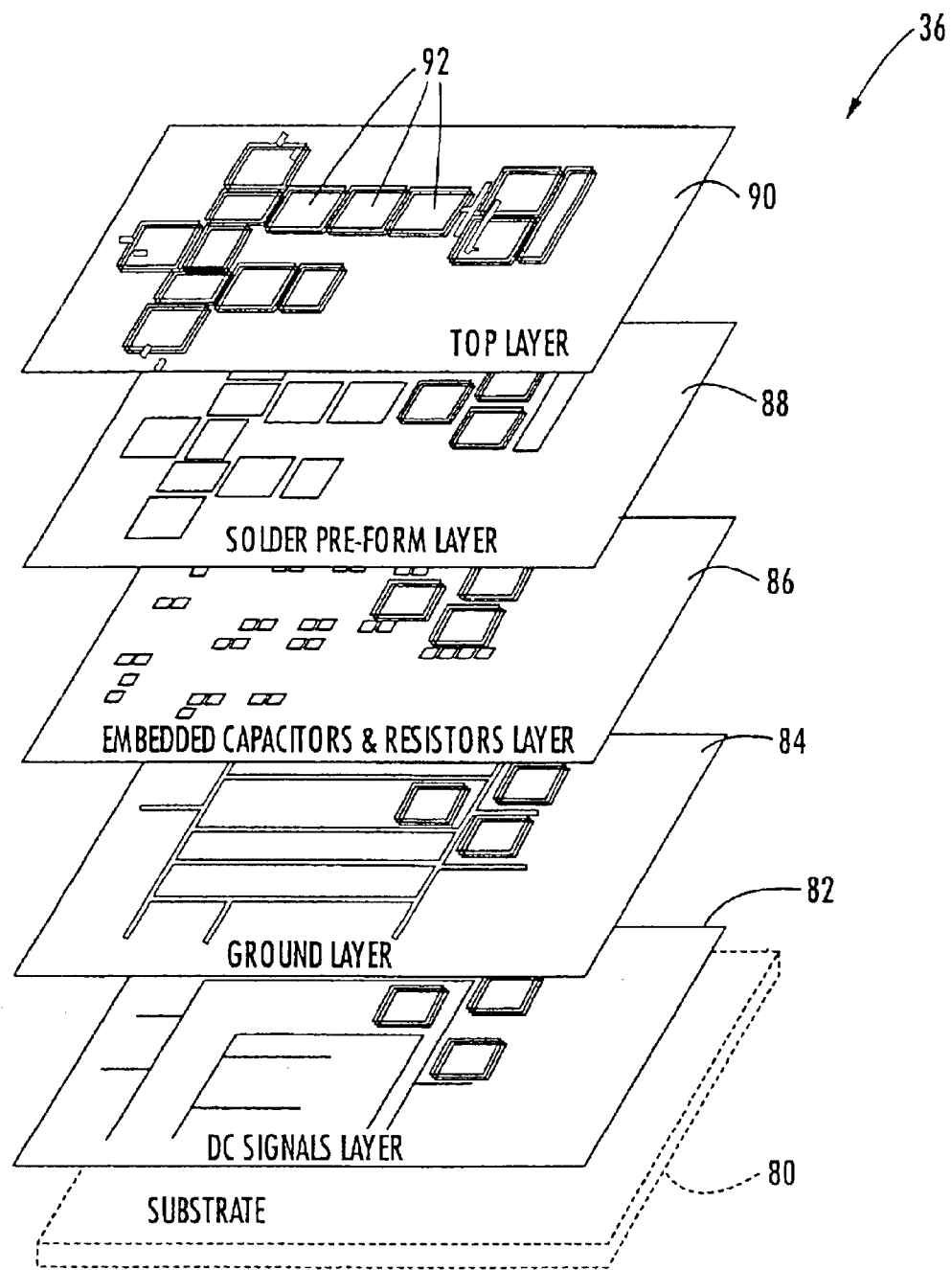
FIG. 3 is an enlarged isometric view of a board formed of a dielectric material such as ceramic of the type that could be used with the present invention.

FIG. 3 illustrates one type of board that can be used with the present invention. As illustrated, a substrate board 80 supports different layers of low temperature transfer tape (green sheets) technology sheets, including a DC signal layer 82, a ground layer 84, embedded capacitors and resistors layer 86, solder preform layer 88, and top layer 90. The substrate board 80 provides support for the various layers. Cut-outs 92 can be formed with appropriate interconnects, signal lines and conductive vias, signal lines and other components included within the overall board 80 structure.

Figure 4A:
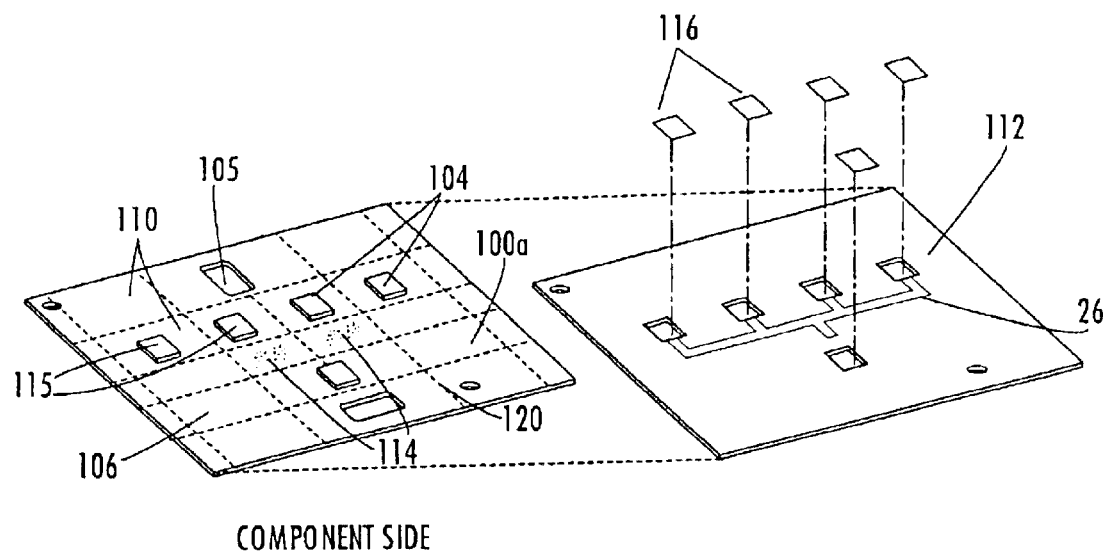
FIGS. 4A and 4B are isometric views of the respective component and backside of a large carrier that is segmented into smaller sections using stress relief grooves on the backside and showing raised pedestals that are etched on the component side.

In accordance with the present invention, FIGS. 4A, 4B, 5A and 5B illustrate two embodiments of the present invention where a CTE matched carrier, as shown in FIG. 1A prior art, is now replaced with a large non-CTE matched carrier 100, such as made from aluminum, copper, nickel-plated copper or similar material. A large, mismatched carrier can be used because of the advantageous segmentation into subcarriers. It is known that the coefficient of thermal expansion for copper and related materials is between about 16 and 17 ppm/degrees C., while Galium Arsenide (GaAs) MMIC chips and alumina or other ceramic substrates used therewith have coefficient of thermal expansions between about 6 and 7 ppm/degree C. Because of the CTE mismatch, more expensive copper tungsten (CuW) or aluminum silicon carbide (AiSiC) have been used as the CTE matched carrier for these alumina or other ceramic substrates and MMIC chips. These CTE matched materials have traditionally been attached by solder or silver epoxy. It is known, however, that the contact surface between the two different CTE matched materials is made small, compliant epoxy can be used to bond the two surfaces. FIGS. 4A, 4B, 5A and 5B illustrate how a large carrier, such as shown in FIG. 1A, is segmented into smaller sections. The carier in one aspect of the invention is formed substantially from copper or aluminum, and could be a nickel plated copper. The costly machining of pedestals has been replaced by the lower cost chemical etching of copper to form pedestals 104 using techniques known to those skilled in the art. Through holes 105 provide part alignment and other means as suggested to those skilled in the art. The etched component side 106 shown in FIG. 4A illustrates the etched pedestals 104 in accordance with the present invention.

Figure 4B:
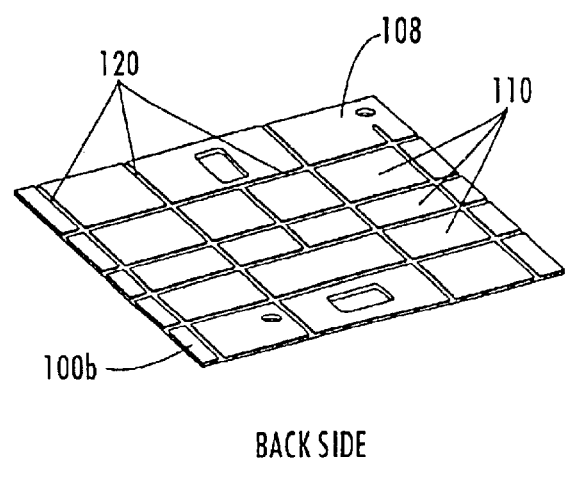

In addition to etching of the pedestals, the backside 108, as shown in FIG. 4B, can be etched and subdivided into smaller size subcarriers 110 while also thinning out thickness of the material. Typically, these carriers 100 are a few mils thick and the etching will be controlled by techniques known to those skilled in the art. The alumina or other ceramic circuit board 112 is adhesively attached to those areas defined by the copper subcarriers, some having the respective pedestals on the component side 100a, using a compliant epoxy 114 such as DIEMAT 4030LD. The MMIC chips 116 are attached directly to the carrier 100 on top of the pedestals, using a compliant epoxy 115 with adequate thermal properties, such as DIEMAT 6030HK. Techniques known to those skilled in the art are used for applying the compliant epoxy and the board and chips. The compliant epoxy provides improved thermal transfer without a requirement for soldering.

FIGS. 4A and 4B illustrate how an etchant is used to form stress portions as grooves 120 of a mil or a few mils deep on the backside 100b to subdivide the carrier 100 into smaller sections and form the subcarriers 110. As illustrated, the stress relief grooves are linear lines that intersect each other and form rectangular subcarriers. Naturally, other geometric configurations could be used.

Figure 5A:
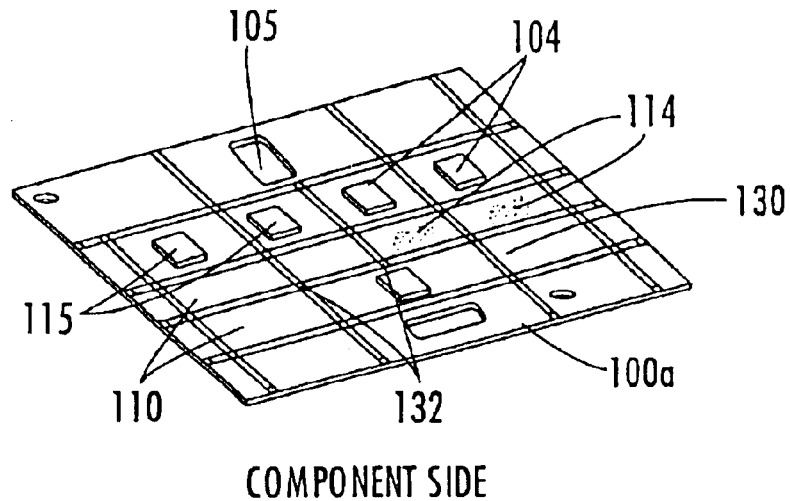
FIGS. 5A and 5B are isometric views of a large carrier segmented into smaller sections and showing stress relief cuts that extend from the backside to the component side with subcarrier sections.
Figure 5B:
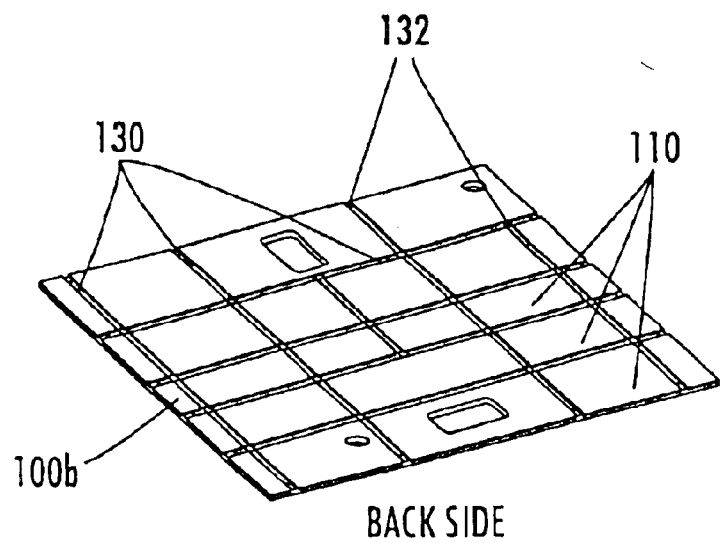

FIGS. 5A and 5B illustrate that an etchant or other means can be used to etch all the way through the carrier and form stress relief cuts 130 with connecting joints 132 at the intersections of linear cut lines. It is evident that the subcarriers 110 are "floating" relative to each other by the formation of stress relief cuts. The stress relief provided by the grooves or cuts and "floating" subcarriers allows a total surface area that will be secured and subject to CTE mismatch to be much equivalently smaller than the total carrier, and thus, allow epoxy attachment between mismatched materials, such as the copper carrier, alumina substrate, and MMIC chips. Other types of grooves or cuts as suggested by those skilled in the art can be used in the present invention.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A method of interfacing a dielectric substrate having a surface on which radio frequency circuits and microstrip lines are formed, and at least one MMIC chip opening dimensioned for receiving a MMIC chip, at least one microwave monolithic integrated circuit (MMIC) received through the opening, and a metallic carrier having a coefficient of thermal expansion (CTE) that is not matched with the ceramic substrate and the MMTC and secured to the dielectric substrate comprising the steps of:

forming a pedestal on the carrier on which the MMIC chip is received for connection to the radio frequency circuits and microstrip lines;

segmenting the carrier with stress relief portions to form subcarriers; and bonding the carrier with the dielectric substrate by an adhesive positioned at an area defined by the subcarriers such that the stress relief portions and formed subcarriers provide stress relief during expansion and contraction created by temperature changes.

2. A method according to claim 1, wherein the step of segmenting the carrier comprises the step of etching the carrier to form the stress relief portions.

3. A method according to claim 1, and further comprising the step of forming grooves on the carrier for segmenting the carrier into subcarriers.

4. A method according to claim 1, and further comprising the step of forming cut lines through the carrier for segmenting the carrier into subcarriers.

5. A method according to claim 4, and further comprising the step of forming cut lines through the side of carrier opposite the side to which the dielectric substrate is attached.

6. A method according to claim 1, and further comprising the step of forming the carrier from substantially copper or aluminum.

7. A method according to claim 6, and further comprising the step of forming the carrier from nickel plated copper.

8. A method according to claim 1, and further comprising the step of forming the pedestals by etching.

9. A method according to claim 1, and further comprising the step of attaching a MMIC chip to the pedestal using an adhesive.

10. A method according to claim 1, and further comprising the step of securing the carrier and dielectric substrate by an adhesive.

11. A microwave monolithic integrated circuit (MMIC) assembly comprising:

a dielectric substrate having a least one MMIC chip opening dimensioned for receiving a MMIC chip;

a carrier secured to the dielectric substrate and having at least one raised pedestal that is positioned at the MMTC chip opening and adapted to receive thereon a MMIC chip; and stress relief portions formed in the metallic carrier that provide stress relief during expansion and contraction created by temperature changes.

12. A microwave monolithic integrated circuit (MNIC) assembly according to claim 11, wherein said dielectric substrate comprises radio frequency circuits and microstrip lines adapted to connect to a MMIC chip when a MMIC chip is secured on the pedestal.

13. A microwave monolithic integrated circuit (MMIC) assembly according to claim 11, wherein said stress relief portions segment the metallic carrier into subcarriers.

14. A microwave monolithic integrated circuit (MMIC) assembly according to claim 11, wherein said carrier is adhesively bonded to said dielectric substrate.

15. A microwave monolithic integrated circuit (MMIC) assembly according to claim 11, wherein said stress relief portions comprise cut lines.

16. A microwave monolithic integrated circuit (MMTC) assembly according to claim 15, wherein said cut lines extend through said carrier.

17. A microwave monolithic integrated circuit (MMIC) assembly according to claim 15, wherein said cut lines are formed by etching.

18. A microwave monolithic integrated circuit (MMIC) assembly according to claim 11, wherein said carrier is formed from a material having a different coefficient of thermal expansion from said dielectric substrate.

19. A microwave monolithic integrated circuit (MMIC) assembly according to claim 18, wherein said carrier is formed from a metallic material.

20. A microwave monolithic integrated circuit (MMIC) assembly according to claim 19, wherein said carrier is formed from aluminum or copper.

21. A microwave monolithic integrated circuit (MMIC) assembly according to claim 11, wherein said at least one pedestal is formed by etching.

* * * * *

UNITED STATES PATENT AND TRADEMARK OFFICE
CERTIFICATE OF CORRECTION

PATENT NO. : 6,816,041 B2
DATED : November 9, 2004
INVENTOR(S) : Ammar et al.

It is certified that error appears in the above-identified patent and that said Letters Patent is hereby corrected as shown below:

Column 1,
Line 8, delete "filled Aug. 20" substitute -- filed Aug. 20 --

Column 5,
Line 29, delete "1 x 10 inch" substitute -- 1 x 1 inch --

Column 9,
Line 23, delete "MMTC" substitute -- MMIC --

Column 10,
Lines 14 and 34, delete "MMTC" substitute -- MMIC --
Line 19, delete "MNIC" substitute -- MMIC --

Signed and Sealed this

Seventeenth Day of May, 2005

JON W. DUDAS
*Director of the United States Patent and Trademark Office*